(12) United States Patent
Yang et al.

(10) Patent No.: US 6,538,237 B1
(45) Date of Patent: Mar. 25, 2003

(54) APPARATUS FOR HOLDING A QUARTZ FURNACE

(75) Inventors: Ming-Hsun Yang, Tainan (TW); Chen-Mei Fan, Hsin Chu Hsien (TW); Allan Wang, Tainan (TW); June-Yie Kao, Tainan County (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/043,057

(22) Filed: Jan. 8, 2002

(51) Int. Cl.⁷ ................................................ F27B 5/08
(52) U.S. Cl. ...................... 219/390; 219/407; 219/411; 219/405; 118/724; 118/725; 392/418
(58) Field of Search ................................ 219/390, 411, 219/405, 407; 392/416, 418; 118/724, 725, 50.1, 728, 729, 730

(56) References Cited

U.S. PATENT DOCUMENTS

| | | | |
|---|---|---|---|
| 5,279,670 A | * | 1/1994 | Watanabe et al. ........... 118/725 |
| 5,324,540 A | * | 6/1994 | Terada ...................... 427/255.5 |
| 6,031,205 A | * | 2/2000 | Shimazu ..................... 219/390 |
| 6,168,427 B1 | * | 1/2001 | Cho et al. ................... 432/241 |
| 6,187,102 B1 | * | 2/2001 | Yamamoto .................. 118/725 |
| 6,251,189 B1 | * | 6/2001 | Odake et al. ............... 118/715 |

* cited by examiner

Primary Examiner—Teresa Walberg
Assistant Examiner—Shawntina T. Fuqua
(74) Attorney, Agent, or Firm—Tung & Associates

(57) ABSTRACT

An apparatus for fixing the position of a quartz furnace tube in a semiconductor processing furnace is described. The furnace is of the type that has a cylindrical body possessing an open end through which the tube may be withdrawn, and a base postioned on the open end, wherein the tube includes a flange portion secured to the base through which gas may be withdrawn from or introduced into the furnace tube. The tube is coaxially disposed within the furnace body. The apparatus may include two clamp halves each has a half-circular shape for engaging the flange portion of the furnace tube onto the base, and a mounting means for mounting the two clamp halves to the base.

20 Claims, 2 Drawing Sheets

APPARATUS FOR HOLDING A QUARTZ FURNACE

FIELD OF THE INVENTION

The present invention generally relates to a semiconductor processing furnace and more particularly, relates to an apparatus for holding a semiconductor processing furnace tube that is provided in a two-piece construction.

BACKGROUND OF THE INVENTION

In connection with processes used to manufacture semiconductor devices, such as integrated circuits, numerous process steps are carried out in a controlled environment at elevated temperatures. Such processes includes oxidation, diffusion, chemical vapor deposition and annealing. In order to realize elevated processing temperatures, semiconductor wafers are processed in an evacuated chamber, typically in a form of a quartz tube which is housed within a semiconductor furnace.

The most common type of semiconductor furnace is of the so-called "hot wall" electric type which facilitates batch processing of semiconductor wafers. Furthermore, hot wall electric furnaces exhibit excellent temperature stability and precise temperature control. Modern hot wall diffusion furnaces are capable of controlling temperatures over the range of 300°–1200° C. to an accuracy of 0.5° or –0.5° C. Hot wall furnaces were initially designed as horizontal diffusion furnaces, however, more recently, vertical furnaces have gained favor because they present a number of advantages over their horizontal predecessors. These advantages include: elimination of cantilever or soft-landing since the wafers are held in a quartz boat which does not touch the process tube walls; wafers can be loaded and unloaded automatically; and, the clean room footprint of the system is somewhat smaller than that of the conventional horizontal configuration.

FIGS. 1–3 illustrate a conventional semiconductor furnace, generally indicated by the numeral 10 employed to carry out processes used in manufacturing semiconductor devices, such as integrated circuits. The furnace 10 is of the so-called vertical type, having a cylindrical heating body 12 provided with a closed upper end, and a lower open end. The body 12 typically would include a plurality of electrical heating elements (not shown) therein coupled with a suitable power source for heating the interior cavity of the body 12 to a temperature of, for example, 180 to 250° C. The lower end of the heater body 12 is provided with a flat metal base 16 having a circular opening in the middle thereon, coaxial with the longitudinal, central axis of the body 12. Either or both of the body 12 and base 16 may be provided with conduits (not shown) therein coupled with a source of cooling water for accelerating the cool down of the furnace, as may be required in certain manufacturing processes.

A processing chamber in the form of a quartz tube assembly generally indicated by the numeral 35 includes a fragile, quartz tube 14 having a generally cylindrically sidewall disposed within the furnace body 12, coaxial with the latter. The tube 14 secured on a base flange 18 by means of a reaction tube anchor ring 32 and cushion ring 34 which are sleeved over the tube 14 so as to engage a lip 37 on the lower end of the tube 14. A Teflon seal-ring 36 and O-ring 40 are sandwiched between the lip 37 and upper surface of the flange 18. The anchor ring 32 is drawn down against the flange 18 by suitable fasteners to create an air tight seal between the tube 14 and flange 18. The flange 18 includes the three circumferentially spaced mounting ears 22 provided with fasteners 24 that secure the base 18, and thus the tube assembly 35, on standoffs 25 that extend downwardly from the base 16. As best seen in FIG. 3, the anchor ring 32 may be provided with an internal, circumferentially extending fluid conduit coupled with inlets/outlets 39 which are in turn coupled with a source of cooling water in order to draw heat away from the tube assembly 35. The flange 18 also includes an inlet opening 20 which is adapted to be coupled with a vacuum pump (not shown) or gas supply for evacuating the tube and filling it with processing gases.

A semiconductor wafer boat elevator 41 includes a boat support 26 coupled by a lateral arm 28 to a vertical spiral drive 30 which moves the elevator up and down, beneath the furnace 12.

In order to remove or install the tube assembly 35 in the furnace body 12, the fasteners 24 are released and the boat elevator 41 is moved upwardly until the flange rests on the support 26. Motor means (not shown) is then activated to lower the boat elevator 41, whereupon the tube assembly 35 moves downwardly through the bottom opening of the furnace body 12.

Vertical semiconductor furnaces of the type mentioned above employ a quartz tube which typically has a polysilicon coating when used for a deposition or annealing process. The polysilicon deposition reduces the power loss due to quartz reflection or radiation, and reduces the degradation of a boat occasioned by wet etching. Because semiconductor furnaces are subjected to high rates of usage and their components are exposed to harsh operating environments, periodic maintenance must be performed on various furnace components, including the quartz tube assembly.

For instance, as shown in FIGS. 4 and 5, a periodic maintenance procedure is performed when the tube assembly 35 is positioned on a maintenance cart 50. When the anchor ring 32 is mounted onto the base 18 by a plurality of bolts 44, as shown in FIG. 4, the tube assembly 35 is positioned on the maintenance cart 50 and removed from the furnace 10. After the mounting bolts 44 are removed, the anchor ring 32 (also known as a quartz holder ring) and an aluminum gasket 52 must be removed from the quartz tube 14 in order to disassemble the tube assembly 35 for cleaning. In modern semiconductor process equipment, such as in a furnace for processing 300 mm wafers, the outer tube, or quartz tube 14 has a large diameter and length. It becomes a difficult task to remove the quartz holder ring 32 from the quartz tube 14 without accidentally touching the tube. When the quartz holder ring 32 touches the quartz tube 14 during the removal process, the touching can cause scratching of the tube surface and furthermore, generation of contaminating particles from the quartz holder ring 32.

It is therefore an object of the present invention to provide an apparatus for fixing the position of a furnace tube in a semiconductor processing furnace that does not have the drawbacks or shortcomings of the conventional apparatus.

It is another object of the present invention to provide an apparatus for fixing the position of a furnace tube in a semiconductor processing furnace that can be easily removed from the furnace tube.

It is a further object of the present invention to provide an apparatus for fixing the position of a furnace tube in a semiconductor processing furnace wherein the apparatus can be easily removed from the furnace tube without touching the tube surface.

It is another further object of the present invention to provide an apparatus for fixing the position of a furnace tube in a semiconductor processing furnace wherein the apparatus is provided sin two clamp halves for functioning as a quartz holder ring.

It is still another object of the present invention to provide an apparatus for fixing the position of a furnace tube in a semiconductor processing furnace wherein the apparatus is provided in a clam-shell configuration for easy removal from the tube surface.

SUMMARY OF THE INVENTION

In accordance with the present invention, an apparatus for holding a quartz furnace tube or an apparatus for fixing the position of a furnace tube in a semiconductor processing furnace is provided.

In a preferred embodiment, an apparatus for fixing the position of a furnace tube in a semiconductor processing furnace wherein the furnace is of the type that has a cylindrical body with an open end through which the tube may be withdrawn, a base on the open end, and wherein the tube includes a flange secured to the base through which gas may be withdrawn from or introduced into the tube, the tube is coaxially disposed within the furnace body, the apparatus may include two clamp halves each in a half-circular shape for engaging the flange on the tube onto the base; and means for mounting the two clamp halves to the base.

In the apparatus for fixing the position of a furnace tube in a semiconductor processing furnace, the base may be a manifold for withdrawing air from the tube. The two clamp halves may further include an internal cooling means, or an internal cooling that circulate a cooling medium therethrough, or an internal cooling means that circulates a cooling water therethrough. The apparatus may further include a Teflon spacer situated in-between the two clamp halves and the flange of the furnace tube. The furnace tube may be fabricated of quartz. The mounting means may include at least four bolts, or may include six bolts. The two clamp halves each may have a tongue section or a groove section for engaging an opposite clamp half that has a groove section or a tongue section. The two clamp halves may be joined at one end in a clam-shell configuration.

The present invention is further directed to a vertical furnace that is equipped with a quartz furnace tube for processing semiconductor wafers that includes a cylindrical-shaped quartz tube that has a sealed top and an open bottom, the open bottom may be provided with a flange portion; an annular-shaped base through which gas may be withdrawn from or introduced into the tube, the base may have a top surface for sealingly engaging the flange portion of the tube; and two clamp halves situated on top of the flange portion for mounting the tube to the base by mounting means.

The mounting means may include at least four bolts, or may include six bolts. The annular-shaped base may be a manifold that includes at least one gas outlet and at least one gas inlet. The two clamp halves may be connected by a hinge at one end such that the two halves operate in a clam-shell manner. The two clamp halves may further include internal cooling means, or may further include internal cooling means that circulates a cooling medium therethrough. The vertical furnace may further include a Teflon spacer positioned in-between the two clamp halves and the flange of the quartz tube. The two clamp halves may each be provided with a tongue and groove end.

BRIEF DESCRIPTION OF THE DRAWINGS

These and other objects, features and advantages of the present invention will become apparatus from the following detailed description and the appended drawings in which.

DETAILED DESCRIPTION OF THE PREFERRED EMBODIMENT

Figure 1:
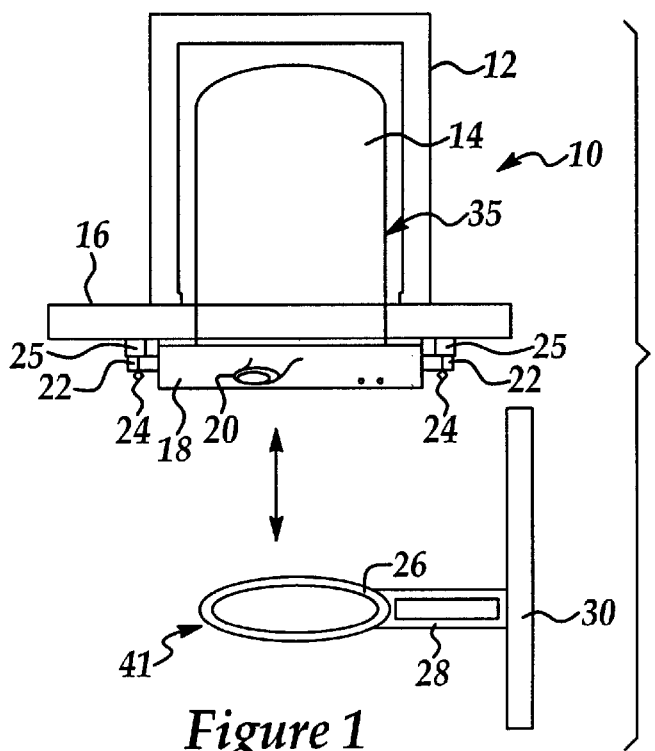
FIG. 1 is a side view of a semiconductor furnace and related boat elevator in a conventional structure.
Figure 3:
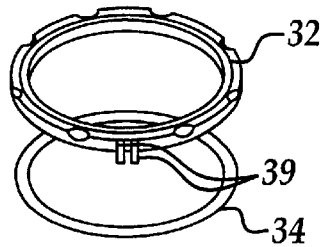
FIG. 3 is an exploded, perspective view of the tube assembly shown in FIG. 2.
Figure 3:
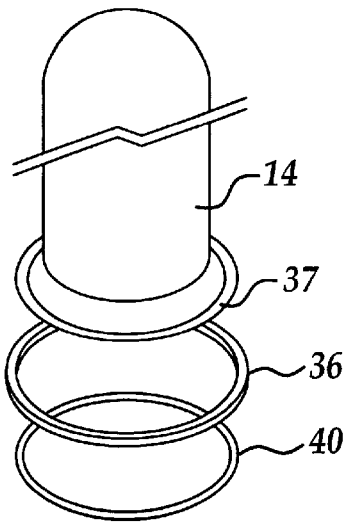
Figure 3:
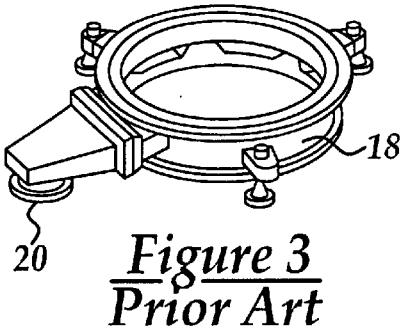
Figure 2:
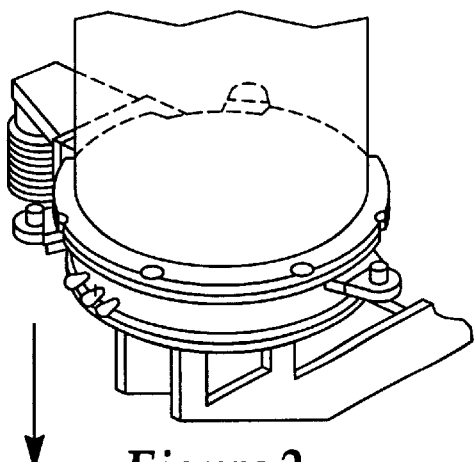
FIG. 2 is an enlarged, fragmentary, perspective view of the lower part of the conventional tube assembly including a tube support arm.
Figure 4:
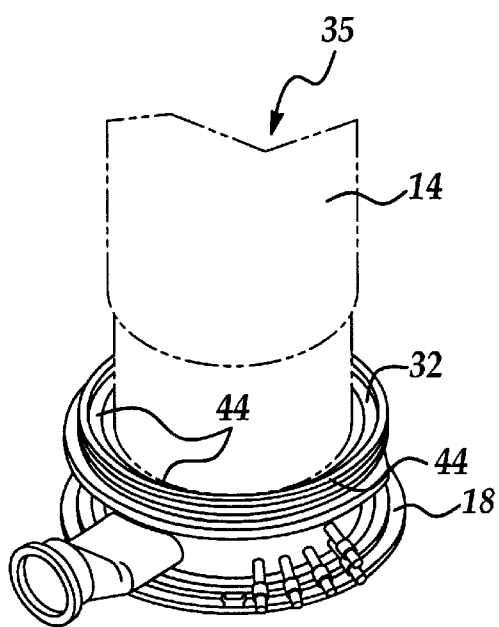
FIG. 4 is a fragmentary, perspective view of the lower part of the conventional tube assembly in an assembled condition.
Figure 5:
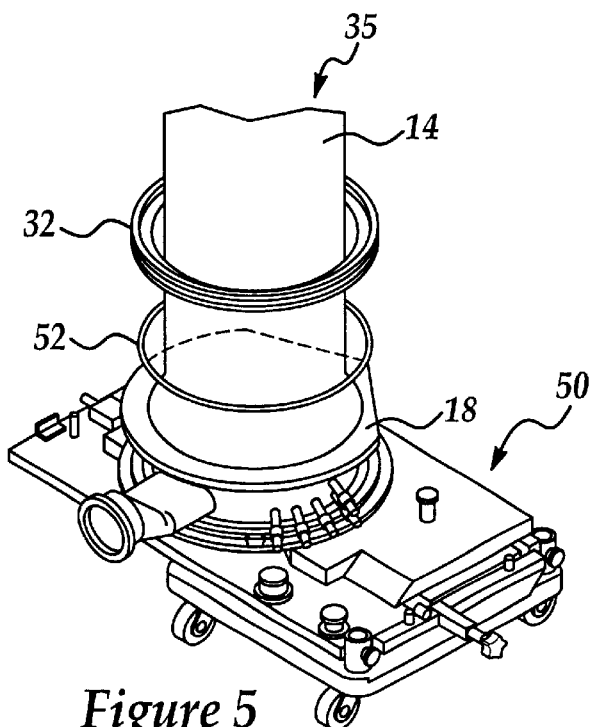
FIG. 5 is a fragmentary, perspective view of the lower part of the conventional tube assembly in a dis-assembled position.

The invention discloses an apparatus for fixing the position of a furnace tube in a semiconductor processing furnace. The furnace involved is of the type that has a cylindrical body with an open end through which the tube may be withdrawn. The furnace has a base on the open end, and wherein the tube may include a flange portion that can be secured to the base through which gas may be withdrawn from or introduced into the tube. The tube may be coaxially disposed within the furnace body.

The apparatus for fixing the position of the furnace tube may include two clamp halves each in a half-circular shape for engaging the flange portion of the furnace tube onto the base of the furnace. The apparatus further includes mounting means for mounting the two clamp halves to the base. Suitable mounting means may be screws or bolts.

In a preferred embodiment, the base of the furnace is a manifold for withdrawing air from the tube, and for feeding reactant gases into the tube. The two clamp halves may further include internal cooling means such that the quartz holding ring can be continuously cooled during the furnace processing at very high temperature, i.e., higher than 500~700°. A suitable cooling medium, such as water may be flown through the cooling means for maintaining the temperature of the quartz holder ring of the present invention.

The invention may further include a Teflon spacer, and/or an aluminum gasket situated in-between the present invention quartz holder ring, i.e., the two clamp halves, and the flange of the furnace tube for achieving an air-tight seal. The furnace tube is most likely formed of a quartz material for functioning at extremely high wafer processing temperatures.

The invention further discloses a vertical furnace that is equipped with a quartz furnace tube for processing semiconductor wafers. The furnace is constructed by a cylindrical-shaped quartz tube, an annular-shaped base onto which the tube is positioned, and a quartz holder ring formed of two clamp halves for mounting the tube to the base. The cylindrical-shaped quartz tube may have a sealed top and an open bottom, wherein the open bottom may be provided with a flange portion. The annular-shaped base may have at least one gas inlet and at least one gas outlet such that gas may be withdrawn from or introduced into the furnace tube. The base may also have a top surface for sealingly engaging the flange portion of the tube, possibly with an additional Teflon spacer and/or an aluminum gasket. The two clamp halves for the quartz holder ring may be positioned on top of the flange portion of the furnace tube for mounting the tube to the base by mounting means, such as by bolts.

By utilizing the present invention novel apparatus, the quartz holder ring can be easily removed from the furnace tube without the danger of scratching or otherwise damaging the tube surface and thus, eliminating any possibility of particle generation.

In another preferred embodiment, the two clamp halves may be connected at one end by a hinge means such that the two clamp halves cooperates in a clam-shell manner such that it can be easily removed from a furnace tube without difficulty.

Figure 6:
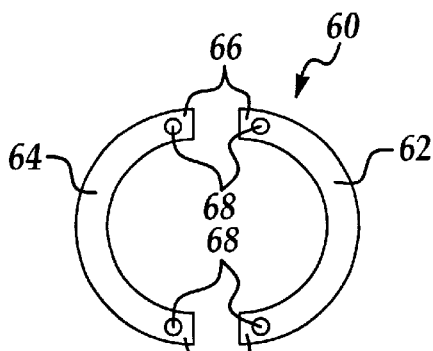
FIG. 6 is a top view of a present invention quartz holder ring constructed in two halves.

Referring now to FIG. 6, wherein a present invention quartz holder ring 60 is shown. The quartz holder ring 60 may be constructed of aluminum. The quartz holder ring 60 is constructed in two clamp halves 62 and 64. The two clamp halves 62, 64 each is provided with an end portion 66 that has an aperture 68 therethrough. The two clamp halves 62, 64 may have a suitable thickness, i.e., between about 3 mm and about 10 mm. The inner diameter of the two clamp halves 62, 64 should be slightly larger than the outside diameter of the quartz tube 14 that it surrounds.

Figure 7:
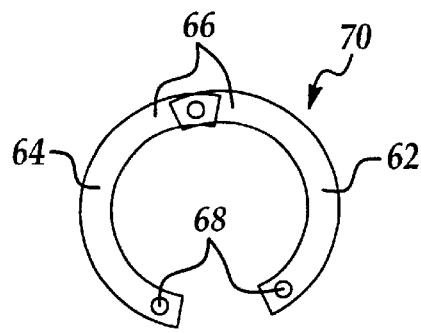
FIG. 7 is another embodiment of the present invention quartz holder ring constructed by two halves that are hinged together at one end forming a clam-shell construction.

In another preferred embodiment, the present invention quartz holder ring 70 may be constructed in a clam-shell construction, as shown in FIG. 7. In this construction, the two ends 66 of the two clamp halves 62, 64 are connected together by a hinge 72 so that the quartz holder ring 70 can be easily removed from the quartz tube 14 by removing mounting means, i.e., bolts from the apertures 68.

Figure 8:
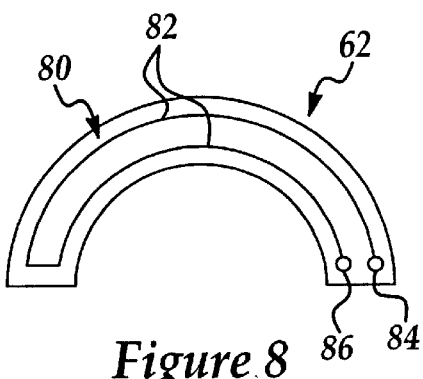
FIG. 8 is an enlarged, top view of a present invention clamp halve equipped with an internal cooling passageway.

The present invention novel quartz holder ring 60, 70 may further be constructed with internal cooling means 80, such as shown in FIG. 8. The internal cooling means 80 may be suitably an internal cooling channel 82 that is provided embedded in the clamp half 62 with a cooling medium inlet 84 and a cooling medium outlet 86. Any suitable cooling medium, i.e., cooling fluid may be used for circulating through the cooling channels 82. For instance, chilled water may be used as the suitable cooling medium.

Figure 9:
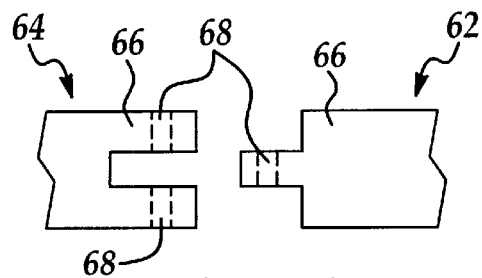
FIG. 9 is a cross-sectional view of two ends of two separate clamp halves with a tongue and groove construction.

The ends 66 of the two clamp halves 62, 64 may be arranged in a tongue and groove manner, as shown in FIG. 9 in a cross-sectional view. In the tongue and groove manner, a tongue section on the clamp half 62 mates with the groove section on the clamp half 64 such that an aperture 68 can be aligned for the installation of a mounting bolt (not shown)

The present invention apparatus for holding a quartz furnace tube, or for fixing the position of a quartz furnace tube in a semiconductor processing furnace has therefore been amply described in the above description and in the appended drawings of FIGS. 6~9.

While the present invention has been described in an illustrative manner, it should be understood that the terminology used is intended to be in a nature of words of description rather than of limitation.

Furthermore, while the present invention has been described in terms of two preferred embodiments, it is to be appreciated that those skilled in the art will readily apply these teachings to other possible variations of the inventions.

The embodiment of the invention in which an exclusive property or privilege is claimed are defined as follows.

What is claimed is:

1. An apparatus for fixing the position of a furnace tube in a semiconductor processing furnace, said furnace being of the type having a cylindrical body with an open end through which said tube may be withdrawn, and a base on said open end, and wherein said tube includes a flange secured to said base through which gas may be withdrawn from or introduced into said tube, said tube being coaxially disposed within said furnace body, said apparatus comprising:

two clamp halves each in a half-circular shape for engaging said flange on said tube to said base; and means for mounting said two clamp halves to said base.

2. An apparatus for fixing the position of a quartz tube in a semiconductor processing furnace according to claim 1, wherein said base is a manifold for withdrawing air from said tube.

3. An apparatus for fixing the position of a quartz tube in a semiconductor processing furnace according to claim 1, wherein said two clamp halves further includes internal cooling means.

4. An apparatus for fixing the position of a quartz tube in a semiconductor processing furnace according to claim 1, wherein said two clamp halves further includes internal cooling means that circulates a cooling medium therethrough.

5. An apparatus for fixing the position of a quartz tube in a semiconductor processing furnace according to claim 1, wherein said two clamp halves further includes internal cooling means that circulates a cooling medium therethrough.

6. An apparatus for fixing the position of a quartz tube in a semiconductor processing furnace according to claim 1 further comprising a Teflon spacer situated in-between said two clamp halves and said flange of the furnace tube.

7. An apparatus for fixing the position of a quartz tube in a semiconductor processing furnace according to claim 1, wherein said furnace tube is fabricated of quartz.

8. An apparatus for fixing the position of a quartz tube in a semiconductor processing furnace according to claim 1, wherein said mounting means comprises at least four bolts.

9. An apparatus for fixing the position of a quartz tube in a semiconductor processing furnace according to claim 1, wherein said mounting means comprises at least six bolts.

10. An apparatus for fixing the position of a quartz tube in a semiconductor processing furnace according to claim 1, wherein said two clamp halves each having a tongue section or a groove section for engaging an opposite clamp halve that has a groove section or a tongue section.

11. An apparatus for fixing the position of a quartz tube in a semiconductor processing furnace according to claim 1, wherein said two clamp halves are joined at one end in a clam-shell configuration.

12. A vertical-shaped quartz furnace tube for processing semiconductor wafers comprising:

a cylindrical-shaped quartz tube having a sealed top and an open bottom, said open bottom being provided with a flange portion;

an annular-shaped base through which gas may be withdrawn from or introduced into said tube, said base having a top surface for sealingly engaging said flange portion of the tube; and two clamp halves situated on top of said flange portion for mounting said tube to said base by mounting means.

13. A vertical furnace equipped with a quartz furnace tube for processing semiconductor wafers according to claim 12, wherein said mounting means comprises at least four bolts.

14. A vertical furnace equipped with a quartz furnace tube for processing semiconductor wafers according to claim 12, wherein said mounting means comprises at least six bolts.

15. A vertical furnace equipped with a quartz furnace tube for processing semiconductor wafers according to claim 12, wherein said annular-shaped base is a manifold that includes at least one gas outlet and at least one gas inlet.

16. A vertical furnace equipped with a quartz furnace tube for processing semiconductor wafers according to claim 12, wherein said two clamp halves are connected by a hinge at one end such that the two clamp halves operate in a clam-shell manner.

17. A vertical furnace equipped with a quartz furnace tube for processing semiconductor wafers according to claim 12, wherein said two clamp halves further comprises internal cooling means.

18. A vertical furnace equipped with a quartz furnace tube for processing semiconductor wafers according to claim 12, wherein said two clamp halves further comprises internal cooling means that circulates a cooling medium therethrough.

19. A vertical furnace equipped with a quartz furnace tube for processing semiconductor wafers according to claim 12 further comprising a Teflon spacer positioned in-between said two clamp halves and said flange of the quartz tube.

20. A vertical furnace equipped with a quartz furnace tube for processing semiconductor wafers according to claim 12, wherein said two clamp halves each being provided with a tongue and groove end.

* * * * *